United States Patent
Summers et al.

(10) Patent No.: US 8,233,261 B2
(45) Date of Patent: Jul. 31, 2012

(54) COMPOSITE ORGANIC ENCAPSULANTS

(75) Inventors: John D Summers, Chapel Hill, NC (US); Tsutomu Mutoh, Tochigi (JP)

(73) Assignee: CDA Processing Limited Liability Company, Wilmington, DE (US)

( * ) Notice: Subject to any disclaimer, the term of this patent is extended or adjusted under 35 U.S.C. 154(b) by 249 days.

(21) Appl. No.: 12/514,822

(22) PCT Filed: Dec. 11, 2007

(86) PCT No.: PCT/US2007/025296
§ 371 (c)(1),
(2), (4) Date: May 14, 2009

(87) PCT Pub. No.: WO2008/073409
PCT Pub. Date: Jun. 19, 2008

(65) Prior Publication Data
US 2010/0067168 A1    Mar. 18, 2010

Related U.S. Application Data

(60) Provisional application No. 60/874,598, filed on Dec. 12, 2006.

(51) Int. Cl.
*H01G 4/00* (2006.01)
*H01G 4/06* (2006.01)

(52) U.S. Cl. .................... 361/301.3; 361/311
(58) Field of Classification Search ......... 361/311–313, 361/301.4, 761–763
See application file for complete search history.

(56) References Cited

U.S. PATENT DOCUMENTS

| | | | |
|---|---|---|---|
| 4,323,948 A * | 4/1982 | Mercier et al. | 361/315 |
| 6,317,023 B1 | 11/2001 | Felten | |
| 6,860,000 B2 | 3/2005 | Felten | |
| 2002/0103303 A1* | 8/2002 | Kodemura | 525/262 |
| 2005/0011857 A1 | 1/2005 | Borland et al. | |

FOREIGN PATENT DOCUMENTS
EP  1 553 134   7/2005
EP  1 612 818   1/2006

OTHER PUBLICATIONS

International Preliminary Report on Patentability in PCT/US2007/025296 and issued on Jun. 16, 2009.
International Search Report and Written Opinion issued in PCT/US2007/025296 and mailed on Jul. 18, 2008.

\* cited by examiner

*Primary Examiner* — Eric Thomas

(57) ABSTRACT

This invention relates to compositions, and the use of such compositions for protective coatings, particularly of electronic devices. The invention concerns a fired-on-foil ceramic capacitors coated with a composite encapsulant and embedded in a printed wiring board.

11 Claims, 4 Drawing Sheets

Continue to Fig. 2E

COMPOSITE ORGANIC ENCAPSULANTS

This patent application claims priority under 35 U.S.C. §119 from U.S. Provisional Application Ser. No. 60/874,598 (filed Dec. 12, 2006). It is also a National Stage Entry of PCT Patent Application No. PCT/US07/25296 with a filing date of Dec. 12, 2007.

FIELD OF THE INVENTION

This invention relates to compositions, and the use of such compositions for protective coatings. In one embodiment, the compositions are used to protect electronic device structures, particularly embedded fired-on-foil ceramic capacitors, from exposure to printed wiring board processing chemicals and for environmental protection.

TECHNICAL BACKGROUND OF THE INVENTION

Electronic circuits require passive electronic components such as resistors, capacitors, and inductors. A recent trend is for passive electronic components to be embedded or integrated into the organic printed circuit board (PCB). The practice of embedding capacitors in printed circuit boards allows for reduced circuit size and improved circuit performance. Embedded capacitors, however, must meet high reliability requirements along with other requirements, such as high yield and performance. Meeting reliability requirements involves passing accelerated life tests. One such accelerated life test is exposure of the circuit containing the embedded capacitor to 1000 hours at 85% relative humidity, 85° C. under 5 volts bias. Any significant degradation of the insulation resistance would constitute failure.

High capacitance ceramic capacitors embedded in printed circuit boards are particularly useful for decoupling applications. High capacitance ceramic capacitors may be formed by "fired-on-foil" technology. Fired-on-foil capacitors may be formed from thick-film processes as disclosed in U.S. Pat. No. 6,317,023B1 to Felten or thin-film processes as disclosed in U.S. Patent Application 20050011857 A1 to Borland et al.

Thick-film fired-on-foil ceramic capacitors are formed by depositing a thick-film capacitor dielectric material layer onto a metallic foil substrate, followed by depositing a top copper electrode material over the thick-film capacitor dielectric layer and a subsequent firing under copper thick-film firing conditions, such as 900-950° C. for a peak period of 10 minutes in a nitrogen atmosphere.

The capacitor dielectric material should have a high dielectric constant (K) after firing to allow for manufacture of small high capacitance capacitors suitable for decoupling. A high K thick-film capacitor dielectric is formed by mixing a high dielectric constant powder (the "functional phase") with a glass powder and dispersing the mixture into a thick-film screen-printing vehicle.

During firing of the thick-film dielectric material, the glass component of the dielectric material softens and flows before the peak firing temperature is reached, coalesces, encapsulates the functional phase, and finally forms a monolithic ceramic/copper electrode film.

The foil containing the fired-on-foil capacitors is then laminated to a prepreg dielectric layer, capacitor component face down to form an inner layer and the metallic foil may be etched to form the foil electrodes of the capacitor and any associated circuitry. The inner layer containing the fired-on-foil capacitors may now be incorporated into a multilayer printed wiring board by conventional printing wiring board methods.

The fired ceramic capacitor layer may contain some porosity and, if subjected to bending forces due to poor handling, may sustain some microcracks. Such porosity and microcracks may allow moisture to penetrate the ceramic structure and when exposed to bias and temperature in accelerated life tests may result in low insulation resistance and failure.

In the printed circuit board manufacturing process, the foil containing the fired-on-foil capacitors may also be exposed to caustic stripping photoresist chemicals and a brown or black oxide treatment. This treatment is often used to improve the adhesion of copper foil to prepreg. It consists of multiple exposures of the copper foil to caustic and acid solutions at elevated temperatures. These chemicals may attack and partially dissolve the capacitor dielectric glass and dopants. Such damage often results in ionic surface deposits on the dielectric that results in low insulation resistance when the capacitor is exposed to humidity. Such degradation also compromises the accelerated life test of the capacitor.

It is also important that, once embedded, the encapsulated capacitor maintain its integrity during downstream processing steps such as the thermal excursions associated with solder reflow cycles or overmold baking cycles. Delaminations and/or cracks occurring at any of the various interfaces of the construction or within the layers themselves could undermine the integrity of the embedded capacitor by providing an avenue for moisture penetration into the assembly.

An approach to rectify these issues is needed. Various approaches to improve embedded passives have been tried. An example of an encapsulant composition used to reinforce embedded resistors may be found in U.S. Pat. No. 6,860,000 to Felten.

SUMMARY OF THE INVENTION

This invention concerns a fired-on-foil ceramic capacitor coated with a composite encapsulant and embedded in a printed wiring board is disclosed. Multi-layer encapsulant compositions are disclosed comprising:

(a) a first layer (the layer directly contacting the capacitor element) made of a polyimide with a water absorption of 2% by weight or less; optionally one or more of an electrically insulated filler, a defoamer and a colorant and one or more organic solvents. The compositions have a curing temperature of about 300° C. or less. Optionally, a hindered hydrophobic epoxy may be added to the composition.

(b) a second layer (formed directly over the first layer) comprises an epoxy containing cyclic olefin resin with a water absorption of 2% by weight or less; one or more phenolic resins with water absorption of less than 2% by weight or less; an epoxy catalyst; optionally one or more of an electrically insulated filler, a defoamer and a colorant and one or more organic solvents. The compositions have a cure temperature of about 300° C. or less.

The first and second layers are applied sequentially and form a consolidated two-layer composite coating when cured.

Compositions are disclosed comprising: a polyimide with a water absorption of 2% or less; optionally one or more electrically insulated fillers, defoamers and colorants and an organic solvent. The compositions have a consolidation temperature of about 300° C. or less.

Compositions are also disclosed comprising: an epoxy containing cyclic olefin resin with a water absorption of 2% or less; an epoxy catalyst; optionally one or more electrically insulated fillers, defoamers and colorants and an organic solvent. The compositions have a cure temperature of about 300° C. or less.

The invention is also directed to a method of encapsulating a fired-on-foil ceramic capacitor with a two-layer encapsulant, the first layer comprising a polyimide with a water absorption of 2% or less; optionally one or more electrically insulated fillers, defoamers and colorants and an organic solvent. The second layer comprises an epoxy-containing cyclic olefin resin with a water absorption of 2% or less, one or more phenolic resins with water absorption of 2% or less, an epoxy catalyst, optionally one or more of an inorganic electrically insulating filler, a defoamer and a colorant, and one or more of an organic solvent to provide an uncured composition. The two compositions are applied sequentially with a baking step between applications to encapsulate a fired-on-foil ceramic capacitor. The encapsulant is then cured at a temperature equal to or less than about 300° C.

The inventive compositions containing the organic materials can be applied as an encapsulant to any other electronic component or mixed with inorganic electrically insulating fillers, defoamers, and colorants, and applied as an encapsulant to any electronic component.

According to common practice, the various features of the drawings are not necessarily drawn to scale. Dimensions of various features may be expanded or reduced to more clearly illustrate the embodiments of the invention.

DETAILED DESCRIPTION OF THE INVENTION

Figure 1A:
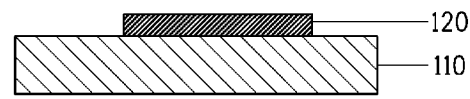
FIG. 1A through 1G show the preparation of capacitors on commercial 96% alumina substrates that were covered by the composite encapsulant compositions and used as a test vehicles to determine the composite encapsulant's resistance to selected chemicals.

The present invention provides an organic two-layer encapsulant composition for coating one or more embedded formed-on-foil ceramic capacitors, said two-layer encapsulant comprising a first encapsulant layer and a second encapsulant layer wherein said first encapsulant layer comprises (a) a polyimide and said second encapsulant layer comprises (c) an epoxy-containing cyclic olefin resin, (d) a phenolic resin, (e) an epoxy catalyst; and wherein said embedded formed-on-foil ceramic capacitors comprise a capacitor element and a prepreg wherein said first encapsulant layer is in direct contact with said capacitor element and said second encapsulant layer is in direct contact with said first encapsulant layer.

The first encapsulant layer at least partially covers said capacitor element. Preferably, the first encapsulant layer substantially or fully covers the capacitor element. The second capacitor layer at least partially covers said first encapsulant layer. Preferably, the second capacitor layer substantially or fully covers the first encapsulant layer or the first encapsulant layer and the remainder of the capacitor element.

A formed-on-foil ceramic capacitor coated with a composite encapsulant and embedded in a printed wiring board is disclosed. The application and processing of the composite encapsulant is designed to be compatible with printed wiring board and integrated circuit (IC) package processes. It also provides protection to the fired-on-foil capacitor from moisture, printed wiring board fabrication chemicals prior to and after embedding into the structure, and accommodates mechanical stresses generated by localized differences in relative thermal expansion coefficients of the capacitor element and organic components without delaminating. Application of said composite encapsulant to the formed-on-foil (typically fired-on-foil) ceramic capacitor allows the capacitor embedded inside the printed wiring board to pass 1000 hours of accelerated life testing conducted at 85° C., 85% relative humidity under 5 volts of DC bias.

Multi-layer encapsulant compositions are disclosed comprising a first encapsulant layer and a second encapsulant layer. The first encapsulant layer and the second encapsulant layer are formed from thick film compositions.

First Encapsulant Layer

The first encapsulant layer (the layer directly contacting the capacitor element and at least partially covering said capacitor element) comprises a polyimide with a water absorption of 2% or less, an organic solvent, and optionally one or more of an inorganic electrically insulating filler, a defoamer and a colorant dye. The amount of water absorption is determined by ASTM D-570, which is a method known to those skilled in the art. Optionally, a hindered hydrophobic epoxy may be added to the composition. The first encapsulant layer is formed from a thick film composition comprising at a minimum a polyimide as disclosed below and an organic solvent. The polyimide is present in the thick film composition in the range of 15 to 30 weight percent. In one embodiment, the polymer is present in the range of 18 to 23 weight percent total thick film composition.

Applicants determined that the most stable polymer matrix is achieved with the use of polyimides that also have low moisture absorption of 2% or less, preferably 1.5% or less, more preferably 1% or less. Polymers used in the compositions with water absorption of 1% or less tend to provide consolidated materials with preferred protection characteristics.

Generally, the polyimide component of the present invention can be represented by the general formula:

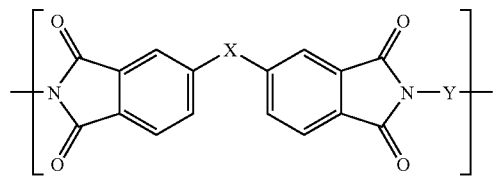

where X can be equal to $C(CF_3)_2$, $SO_2$, O, Chemical bond, $C(CF_3)$phenyl, $C(CF_3)CF_2CF_3$, $C(CF_2CF_3)$phenyl (and combinations thereof); and where Y is derived from a diamine component comprising from 0 to 30 mole percent of a phenolic-containing diamine selected from the group consisting of 2,2'-bis(3-amino-4-hydroxyphenyl)hexafluoropropane (6F-AP), 3,3'-dihydroxy-4,4'-diaminobiphenyl (HAB), 2,4-diaminophenol, 2,3-diaminophenol, 3,3'-diamino-4,4'-dihydroxy-biphenyl, 2,2'-bis(3-amino-4-hydroxyphenyl)hexafluoropropane and mixtures thereof.

Diamines useful in comprising the remaining portion of the diamine component (i.e., that portion comprising from about 70 to 100 mole percent of the total diamine component) can be fluoronated diamines. In one embodiment, the diamines are selected from the group comprising 3,4'-diaminodiphenyl ether (3,4'-ODA), 4,4'-diamino-2,2'-bis(trifluoromethyl)biphenyl (TFMB), 3,3',5,5'-tetramethylbenzidine, 2,3,5,6-tetramethyl-1,4-phenylenediamine, 3,3'-diaminodiphenyl sulfone, 3,3'dimethylbenzidine, 3,3'-bis(trifluoromethyl)benzidine, 2,2'-bis-(p-aminophenyl)hexafluoropropane, bis(trifluoromethoxy)benzidine (TFMOB), 2,2'-bis(pentafluoroethoxy)benzidine (TFEOB), 2,2'-trifluoromethyl-4,4'-oxydianiline (OBABTF), 2-phenyl-2-trifluoromethyl-bis(p-aminophenyl)methane, 2-phenyl-2-trifluoromethyl-bis(m-aminophenyl)methane, 2,2'-bis(2-heptafluoroisopropoxy-tetrafluoroethoxy)benzidine (DFPOB), 2,2-bis(m-aminophenyl)hexafluoropropane (6-FmDA), 2,2-bis(3-amino-4-methylphenyl)hexafluoropropane, 3,6-bis(trifluoromethyl)-1,4-diaminobenzene (2TFMPDA), 1-(3,5-diaminophenyl)-2,2-bis(trifluoromethyl)-3,3,4,4,5,5,5-heptafluoropentane, 3,5-diaminobenzotrifluoride (3,5-DABTF), 3,5-diamino-5-(pentafluoroethyl)benzene, 3,5-diamino-5-(heptafluoropropyl)benzene, 2,2'-dimethylbenzidine (DMBZ), 2,2',6,6'-tetramethylbenzidine (TMBZ), 3,6-diamino-9,9-bis(trifluoromethyl)xanthene (6FCDAM), 3,6-diamino-9-trifluoromethyl-9-phenylxanthene (3FCDAM), 3,6-diamino-9,9-diphenyl xanthene and mixtures thereof. These diamines can be used alone or in combination with one another.

Generally speaking, the present inventors found that if more than about 30 mole percent of the diamine component is a phenolic containing diamine, the polyimide may be susceptible to unwanted water absorption. As such, the diamine component of the present invention can typically comprise from about 0 to about 30 mole percent of a phenolic-containing diamine to be effective. In one embodiment the diamine is present in the range of 1 to 25 mole percent.

The polyimides of the invention are prepared by reacting a suitable dianhydride (or mixture of suitable dianhydrides, or the corresponding diacid-diester, diacid halide ester, or tetracarboxylic acid thereof) with one or more selected diamines. The mole ratio of dianhydride component to diamine component is preferably from between 0.9 to 1.1. Preferably, a slight molar excess of dianhydrides or diamines can be used at mole ratio of about 1.01 to 1.02. End capping agents, such as phthalic anhydride, can be added to control chain length of the polyimide.

Some dianhydrides found to be useful in the practice of the present invention, i.e., to prepare the polyimide component, can be 3,3',4,4'-diphenylsulfone tetracarboxylic dianhydride (DSDA), 2,2-bis(3,4-dicarboxyphenyl) 1,1,1,3,3,3-hexafluoropropane dianhydride (6-FDA), 1-phenyl-1,1-bis(3,4-dicarboxyphenyl)-2,2,2-trifluoroethane dianhydride, 1,1,1,3,3,4,4,4-octylfluoro-2,2-bis(3,4-dicarboxyphenyl)butane dianhydride, 1-phenyl-2,2,3,3,3-pentafluoro-1,1-bis(3,4-dicarboxyphenyl)propane dianhydride, 4,4'-oxydiphthalic anhydride (DOPA), 2,2'-bis(3,4-dicarboxyphenyl)propane dianhydride, 2,2'-bis(3,4-dicarboxyphenyl)-2-phenylethane dianhydride, 2,3,6,7-tetracarboxy-9-trifluoromethyl-9-phenylxanthene dianhydride (3FCDA), 2,3,6,7-tetracarboxy-9,9-bis(trifluoromethyl)xanthene dianhydride (6FCDA), 2,3,6,7-tetracarboxy-9-methyl-9-trifluoromethylxanthene dianhydride (MTXDA), 2,3,6,7-tetracarboxy-9-phenyl-9-methylxanthene dianhydride (MPXDA), 2,3,6,7-tetracarboxy-9,9-dimethylxanthene dianhydride (NMXDA) and combinations thereof. These dianhydrides can be used alone or in combination with one another.

The first encapsulant layer thick film compositions comprise an organic solvent. The choice of solvent or mixtures of solvents will depend in-part on the resins used in the composition. Any chosen solvent or solvent mixtures must dissolve the resins and not be susceptible to separation when exposed to cold temperatures, for example. An exemplary list of solvents are selected from the group consisting of terpineol, ether alcohols, cyclic alcohols, ether acetates, ethers, acetates, cyclic lactones, and aromatic esters. Solvents known to be useful in accordance with the practice of the present invention include organic liquids having both (i.) a Hanson polar solubility parameter between and including any two of the following numbers 2.1, 2.2, 2.3, 2.4, 2.5, 2.6, 2.7, 2.8, 2.9 and 3.0, and (ii) a normal boiling point ranging from between and including any two of the following numbers 200, 210, 220, 230, 240, 250 and 260° C. In one embodiment of the present invention, a useful solvent is selected from one or more dibasic acid ester solvents including, but not limited to, DuPont DBE® solvents including dimethyl succinate, dimethyl glutarate and dimethyl adipate. Other useful solvents include propyleneglycol diacetate (PGDA), Dowanol® PPh, butyl carbitol acetate, carbitol acetate and mixtures of these. Cosolvents may be added provided that the composition is still soluble, performance in screen-printing is not adversely affected, and lifetime storage is also not adversely affected.

Second Encapsulant Layer

The second encapsulant layer (formed directly over the first layer) is formed from a thick film composition comprising an epoxy-containing cyclic olefin resin with a water absorption of 2 weight % or less; one or more phenolic resins with water absorption of less than 2 weight % or less; an epoxy catalyst and one or more organic solvents; optionally one or more of an electrically insulated filler, a defoamer and a colorant. The compositions have a cure temperature of about 300° C. or less. The thick film composition is processed to remove the organic solvent and cure the thick film layer.

The second encapsulant layer at a minimal comprises an epoxy—an epoxy-containing cyclic olefin resin, a phenolic resin, and an epoxy catalyst. The thick film composition used to form the second encapsulant layer further comprises an organic solvent. The second encapsulant layer comprises of epoxy-containing cyclic olefin resins selected from the group consisting of epoxy-modified polynorbornene (Epoxy-PNB), dicyclopentadiene epoxy resin and mixtures thereof. Preferably, the Epoxy-PNB resin, available from Promerus as Avatrel™2390, or dicyclopentadiene epoxy resin used in the compositions will have water absorption of 1% or less. These epoxy-containing cyclic olefin resins are crosslinkable.

The composition of the invention can include an Epoxy-PNB polymer comprising molecular units of formula I and II:

I wherein $R^1$ is independently selected from hydrogen and a $(C_1-C_{10})$alkyl. The term "alkyl" includes those alkyl groups with one to ten carbons of either a straight, branched or cyclic configuration. An exemplary list of alkyl groups include methyl, ethyl, propyl, isopropyl and butyl, and a PNB polymer with crosslinkable sites as depicted by molecular units of formula II:

wherein $R^2$ is a pendant cross-linkable epoxy group and the molar ratio of molecular units of formula II to molecular units of formula I in the Epoxy-PNB polymer is greater than 0 to about 0.4, or greater than 0 to about 0.2. The crosslinkable epoxy group in the PNB polymer provides a site at which the polymer can crosslink with one or more crosslinking agents in the compositions of the invention as the compositions are cured. Only a small amount of crosslinkable sites on the PNB polymer is needed to provide an improvement in the cured material. For example, the compositions can include Epoxy-PNB polymers with a mole ratio as defined above that is greater than 0 to about 0.1.

Phenolic resins with water absorption of 2% or less are required to react with the epoxy to provide an effective moisture resistant material. An exemplary list of phenolic resins useful as thermal crosslinkers that can be used with the crosslinkable polymers include a dicyclopentadiene phenolic resin, and resins of cycloolefins condensed with phenolics. A dicyclopentadiene phenolic resin, available from Borden as Durite® ESD-1819, is preferred.

Applicants have also observed that the use of a crosslinkable Epoxy-PNB polymer in a composition can provide important performance advantages over the corresponding non-crosslinkable PNB polymers. The ability of the Epoxy-PNB polymer to crosslink with crosslinking agents during a thermal cure can stabilize the binder matrix, raise the Tg, increase chemical resistance, or increase thermal stability of the cured coating compositions.

The use of an epoxy catalyst that is not reactive at ambient temperatures is important to provide stability of the crosslinkable composition prior to being used. The catalyst provides catalytic activity for the epoxy reaction with the phenolic during the thermal cure. A catalyst that fulfills these requirements is dimethybenzylamine, and a latent catalyst that fulfills these requirements is dimethylbenzylammonium acetate, which is the reaction product of dimethylbenzylamine with acetic acid.

The compositions include an organic solvent. The choice of solvent or mixtures of solvents will depend in-part on the reactive resins used in the composition. Any chosen solvent or solvent mixtures must dissolve the resins and not be susceptible to separation when exposed to cold temperatures, for example. An exemplary list of solvents are selected from the group consisting of terpineol, ether alcohols, cyclic alcohols, ether acetates, ethers, acetates, cyclic lactones, aromatic esters and mixtures thereof.

Generally, thick-film compositions are mixed and then blended on a three-roll mill. Pastes are typically roll-milled for three or more passes at increasing levels of pressure until a suitable dispersion has been reached. After roll milling, the pastes may be formulated to printing viscosity requirements by addition of solvent.

Curing of the paste or liquid composition is accomplished by any number of standard curing methods including convection heating, forced air convection heating, vapor phase condensation heating, conduction heating, infrared heating, induction heating, or other techniques known to those skilled in the art.

One advantage that the polymers provide to the compositions of the invention is a relatively low cure temperature. The compositions can be cured with a temperature of equal to or less than 190° C. over a reasonable time period. This is particularly advantageous as it is compatible with printing wiring board processes and avoids oxidation of copper foil or damage or degradation to component properties.

It is to be understood, that the 190° C. temperature is not a maximum temperature that may be reached in a curing profile. For example, the compositions can also be cured using a peak temperature up to about 270° C. with a short infrared cure. The term "short infrared cure" is defined as providing a curing profile with a high temperature spike over a period that ranges from a few seconds to a few minutes.

Another advantage that the polymers provide to the compositions of the inventions is a relatively high adhesion to prepreg when bonded to the prepreg using printed wiring board or IC package substrate lamination processes. This allows for reliable lamination processes and sufficient adhesion to prevent de-lamination in subsequent processes or use.

The encapsulant paste compositions of the invention can further include one or more metal adhesion agents. Preferred metal adhesion agents are selected from the group consisting of polyhydroxyphenylether, polybenzimidazole, polyetherimide, polyamideimide, 2-mercaptobenzimidazole (2-MB), and benzotriazole.

The composite encapsulant (two-layer encapsulant) prepared from the two polymer types described above leverages the advantages of each polymer system. The first layer, comprised of essentially polyimide, possesses good adhesion to the capacitive element. This adhesive strength is preserved during solder reflow cycles because the Tg of the polyimide is above the reflow temperature. This layer enhances circuit reliability by reducing the tendency of the structure to delaminate during thermal cycles experienced as part of the conventional circuit board fabrication process. The second, or top, layer is comprised of essentially a hydrophobic epoxy phenolic system. This layer imparts chemical resistance to the encapsulant and protects the underlying polymide and capacitive element from chemical attack, especially during oxide treatments where strong acids and strong bases can be employed. This layer is also very hydrophobic and protects the underlying structures from contact with water.

The thick film compositions disclosed above are used to form a two-layer encapsulant. The two-layer encapsulant is formed over a capacitor element. The first encapsulant layer is formed over the capacitor element and processed (typically baked) to sufficiently remove the organic solvent from the thick film composition to allow for a substantially tack-free surface for the application of the second encapsulant layer (thick film composition). The second encapsulant layer thick film composition is processed to remove the solvent to an extent which ensures few defects and subsequently cured to form a two-layer organic encapsulant and wherein said cured two-layer organic encapsulant provides protection to the capacitor when immersed in sulfuric acid or sodium hydroxide having concentrations of up to 30%. Thus, an embedded capacitor comprising a two-layer encapsulant is formed. This embedded capacitor provides protection to the capacitor when immersed in sulfuric acid or sodium hydroxide having concentrations of up to 30%.

The encapsulant composition of claim 1 wherein said encapsulant composition is cured to form a two-layer organic encapsulant and wherein the cured two-layer organic encapsulant provides protection to the capacitor in an accelerated life test of elevated temperatures, humidities and DC bias.

The two-layer organic encapsulant may be used to fill an etched trench that isolates the top and bottom electrodes of an embedded capacitor.

The two-layer organic encapsulant of the present invention is cured to form a cured organic encapsulant and wherein the water absorption is 1% or less. Furthermore, the second encapsulant layer may be cured at a temperature of less than or equal to 190° C. The second encapsulant layer may be cured to form a cured organic two-layer encapsulant and wherein the adhesion of said encapsulant to the capacitor and to the prepreg above the capacitor is greater than 2 lb force/inch.

The two-layer organic encapsulant may be utilized to form a two-layer encapsulant capacitor wherein said capacitor an embedded capacitor and wherein the circuit board containing encapsulated embedded cured-on-foil capacitor(s) does not delaminate during elevated temperature thermal cycles.

Test procedures used in the testing of the compositions of the invention and for the comparative examples are provided as follows:

Insulation Resistance

Insulation resistance of the capacitors is measured using a Hewlett Packard high resistance meter.

Temperature Humidity Bias (THB) Test

THB Test of ceramic capacitors embedded in printed wiring boards involves placing the printed wiring board in an environmental chamber and exposing the capacitors to 85° C., 85% relative humidity and a 5 volt DC bias. Insulation resistance of the capacitors is monitored every 24 hours. Failure of the capacitor is defined as a capacitor showing less than 50 meg-ohms in insulation resistance.

Brown Oxide Test

The device under test was exposed to an Atotech brown oxide treatment with a series of steps: (1) 60 sec. soak in a solution of 4-8% $H_2SO_4$ at 40° C., (2) 120 sec. soak in soft water at room temperature, (3) 240 sec soak in a solution of 3-4% NaOH with 5-10% amine at 60° C., (4) 120 sec. soak in soft water at room temperature, (5) 120 sec. soak in 20 ml/l $H_2O_2$ and $H_2SO_4$ acid with additive at 40° C., (6) a soak for 120 sec. in a solution of Part A 280, Part B 40 ml/l at 40° C., and (7) a deionized water soak for 480 sec. at room temperature.

Insulation resistance of the capacitor was then measured after the test and failure was defined as a capacitor showing less than 50 Meg-Ohms.

Encapsulant Film Moisture Absorption Test

The ASTM D570 method is used where polyimide solution is coated with a 20-mil doctor knife on a one oz. copper foil substrate. The wet coating is dried at 190° C. for about 1 hour in a forced draft oven to yield a polyimide film of 2 mils thickness. In order to obtain a thickness of greater than 5 mils as specified by the test method, two more layers are coated on top of the dried polyimide film with a 30 min 190° C. drying in a forced draft oven between the second and third coating. The three layer coating is dried 1 hr at 190° C. in a forced draft oven and then is dried in a 190° C. vacuum oven with a nitrogen purge for 16 hrs or until a constant weight is obtained. The polyimide film is removed from the copper substrate by etching the copper using commercially available acid etch technology. Samples of one inch by 3-inch dimensions are cut from the free-standing film and dried at 120° C. for 1 hour. The strips are weighed and immersed in deionized water for 24 hrs. Samples are blotted dry and weighed to determine the weight gain so that the percent water absorption can be calculated. Film samples were also placed in an 85/85 chamber for 48 hours to measure the water uptake of the samples under these conditions.

The following glossary contains a list of names and abbreviations for each ingredient used:

| | |
|---|---|
| 6FDA | 2,2-bis(3,4-dicarboxyphenyl)1,1,1,3,3,3-hexafluoropropane dianhydride |
| TFMB | 4,4'-diamino-2,2'-bis(trifluoromethyl)biphenyl |
| 6F-AP | 2,2'-bis(3-amino-4-hydroxyphenyl) hexafluoropropane |
| Fumed silica | High surface area silica obtainable from several sources, such as Degussa. |
| Organosiloxane antifoam agent | Defoaming agent SWS-203 obtainable from Wacker Silicones Corp. |
| PNB | Polynorbornene Appear-3000B from Promerus LLC of Brecksville, Ohio; Tg 330° C., 0.03% moisture absorption |
| Epoxy-PNB | Epoxy-containing polynorbornene from Promerus LLC of Brecksville, Ohio; Mw of 74,000, Mn of 30,100 |
| Durite ESD-1819 | Dicyclopentadiene phenolic resin from Borden Chemical, Inc. of Louisville, Kentucky. |
| Fumed silica | High surface area silica obtainable from several sources, such as Degussa. |
| Organosiloxane antifoam agent | Defoaming agent SWS-203 obtainable from Wacker Silicones Corp. |

Example 1

Polyimide Resin Preparation

A polyimide was prepared by conversion of a polyamic acid to polyimide with chemical imidization. To a dry three neck round bottom flask equipped with nitrogen inlet, mechanical stirrer and condenser was added 800.45 grams of DMAC, 89.98 grams of 3,3'-bis-(trifluoromethyl)benzidine (TFMB), 3.196 grams 3,3'-dihydroxy-4,4'-diaminobiphenyl (HAB) and 0.878 grams of phthalic anhydride (to control molecular weight).

To this stirred solution was added over one hour 104.87 grams of 3,3',4,4'-diphenylsulfone tetracarboxylic dianhydride (DSDA). The solution of polyamic acid reached a temperature of 33° C. and was stirred without heating for 16 hrs. 119.56 grams of acetic anhydride were added followed by 109.07 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 188.9 grams of product having a number average molecular weight of 46,300 and a weight average molecular weight of 93,900. The molecular weight of the polyimide polymer was obtained by size exclusion chromatography using polystyrene standards. Some of the phenolic groups were acetylated under the conditions used to chemically dehydrate the poly(amic acid) as determined by NMR analysis.

The polyimide was dissolved at 20% solids in a 60/40 weight/weight mixture of propyleneglycol diacetate (PGDA)/Dowanol® PPh.

Example 2

Polyimide Resin Preparation

A polyimide based on 6FDA, TFMB, and 6F-AP (75/25 amine molar ratio) was prepared according to the procedure in Example 1. The yield was 178 g, the number average molecular weight was 39,600 g/m according to GPC analysis, the weight average molecular weight was 84,700 g/m. The polyimide was dissolved at 25% solids in a 50/50 wt./wt. cosolvent of DBE-2 and DBE-3.

Example 3

Encapsulant Preparation from Polyimide Resin of Example 2

A polyimide-based encapsulant composition was prepared according to the following composition and procedure:

| Material | Weight (g) |
|---|---|
| Polymer solution from Example 2 | 1185 |
| RSS-1407 epoxy resin | 25.5 |
| Benzotriazole | 5.5 |

The solution was filtered through 600 mesh screen to remove undissolved particulates. film prepared and analyzed according to the encapsulant film moisture absorption test displayed a moisture uptake of 0.39%.

Example 4

Epoxy Phenolic Encapsulant Preparation

An epoxy-phenolic encapsulant composition was prepared using the following ingredients and processes:

Preparation of Epoxy Medium

Ingredients

| Terpineol | 300 g |
|---|---|
| Avatrel 2390 epoxy resin (AV2390) | 200 g |

A 1 liter resin kettle was fitted with a heating jacket, mechanical stirrer, nitrogen purge, thermometer, and addition port. The terpineol was added to the kettle and heated to 40° C. After the terpineol reached 40° C., the epoxy was added through the addition port to the stirring solvent. After complete addition, the powder gradually dissolved to yield a clear and colorless solution of moderate viscosity. Complete dissolution of the polymer took approximately two hours. The medium was then cooled to room temperature and discharged from the reactor. The solid content of the finished medium was analyzed by heating a known quantity of medium for two hours at 150° C. The solids content was determined to be 40.33% by this method. The viscosity of the medium was also determined to be 53.2 Pa.S. at 10 rpm using a Brookfield Viscometer 2HA, utility cup and number 14 spindle.

Preparation of Phenolic Medium

Ingredients

| Terpineol | 300 g |
|---|---|
| Durite ESD-1819 phenolic resin (ESD1819) | 200 g |

A resin kettle was fitted with a heating mantle, mechanical stirrer, nitrogen purge, thermometer, and addition port. The terpineol was added to the kettle and preheated to 80° C. The phenolic resin was crushed with a mortar and pestle, then added to the terpineol with stirring. After complete addition, the powder gradually dissolved to yield a dark red solution of moderate viscosity. Complete dissolution of the polymer took approximately one hour. The medium was then cooled to room temperature and discharged from the reactor. The solid content of the finished medium was analyzed by heating a known quantity of medium for two hours at 150° C. The solids content was determined to be 40.74% by this method. The viscosity of the medium was also determined to be 53.6 Pa.S. at 10 rpm using a Brookfield Viscometer 2HA, utility cup and number 14 spindle.

Preparation of an encapsulant paste containing 8% Degussa R7200 fumed silica:

Ingredients:

| Epoxy medium | 12.4 g |
|---|---|
| Phenolic medium | 12.4 g |
| Degussa R7200 fumed silica | 2.2 g |
| Terpineol | 2.4 g |
| Organosiloxane antifoam agent | 0.2 g |
| Benzotriazole | 0.1 g |

The epoxy medium, phenolic medium, organosiloxane, and catalyst were combined in a suitable container and hand-stirred for approximately 5 minutes to homogenize the ingredients. The silica was then added in three equal aliquots with hand stirring followed by vacuum mixing at low agitation between each addition. After complete addition of the silica, the crude paste was vacuum mixed for 15 minutes with medium agitation. After mixing, the paste was three roll milled according to the following schedule:

| Pass | Feed roll pressure (psi) | Apron roll pressure (psi) |
|---|---|---|
| 1 | 0 | 0 |
| 2 | 0 | 0 |
| 3 | 100 | 100 |
| 4 | 200 | 100 |
| 5 | 300 | 200 |
| 6 | 400 | 300 |

Terpineol was then added to the finished paste with stirring to modify the paste viscosity and make it suitable for screen printing. film prepared and analyzed according to the encapsulant film moisture absorption procedure exhibited a water uptake of 0.17%

Example 5

Preparation of Ceramic Coupons Containing Encapsulated Ceramic Capacitors, Analysis of Chemical Stability of Encapsulant Capacitors on commercial 96% alumina substrates were covered by encapsulant compositions and used as a test vehicle to determine the encapsulant's resistance to selected chemicals. The test vehicle was prepared in the following manner as schematically illustrated in FIG. 1A through 1G.

Figure 1B:
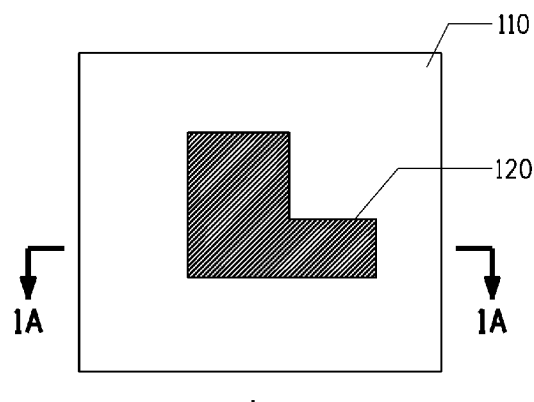

As shown in FIG. 1A, electrode material (EP 320 obtainable from E. I. du Pont de Nemours and Company) was screen-printed onto the alumina substrate to form electrode pattern 120. As shown in FIG. 1B, the area of the electrode was 0.3 inch by 0.3 inch and contained a protruding "finger" to allow connections to the electrode at a later stage. The electrode pattern was dried at 120° C. for 10 minutes and fired at 930° C. under copper thick-film nitrogen atmosphere firing conditions.

Figure 1C:
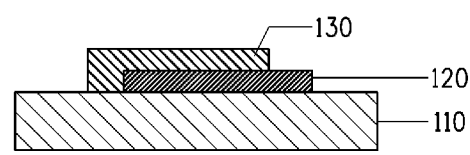
Figure 1D:
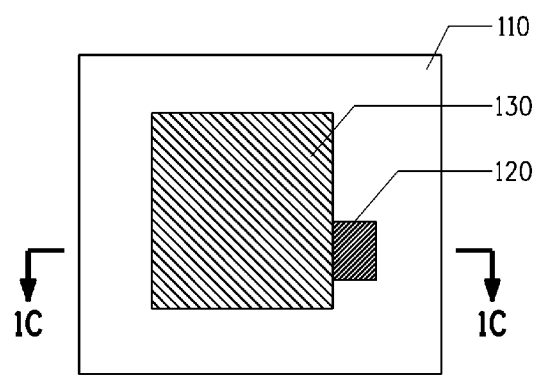

As shown in FIG. 1C, dielectric material (EP 310 obtainable from E.I. du Pont de Nemours and Company) was screen-printed onto the electrode to form dielectric layer 130. The area of the dielectric layer was approximately 0.33 inch by 0.33 inch and covered the entirety of the electrode except for the protruding finger. The first dielectric layer was dried at 120° C. for 10 minutes. A second dielectric layer was then applied, and also dried using the same conditions. A plan view of the dielectric pattern is shown in FIG. 1D.

Figure 1E:
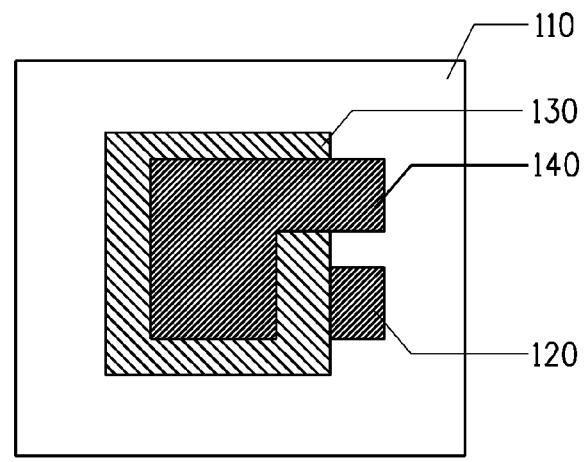

As shown in FIG. 1E, copper paste EP 320 was printed over the second dielectric layer to form electrode pattern 140. The electrode was 0.3 inch by 0.3 inch but included a protruding finger that extended over the alumina substrate. The copper paste was dried at 120° C. for 10 minutes.

The first dielectric layer, the second dielectric layer, and the copper paste electrode were then co-fired at 930° C. under copper thick-film firing conditions.

Figure 1F:
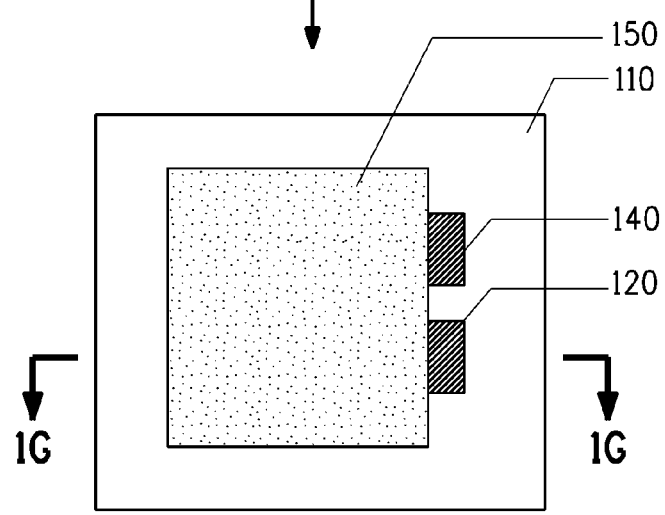
Figure 1G:
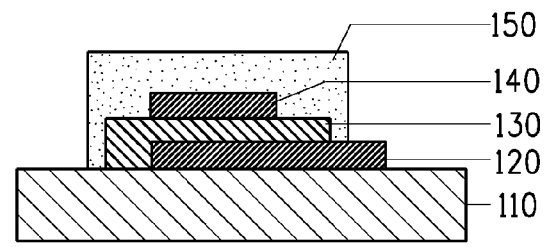

The encapsulant composition of Example 3 was screen printed through a 180 mesh screen over the entirety of the capacitor electrode and dielectric except for the two fingers using the pattern shown in FIG. 1F to form a 0.4 inch by 0.4 inch encapsulant layer 150. The encapsulant layer was dried for 10 minutes at 120° C. Another layer of encapsulant was printed with the formulation prepared in Example 4 through a 325 mesh screen over the first encapsulant layer and dried for 10 minutes at 120° C. A side view of the final stack is shown in FIG. 1G. The two layer composite encapsulant was then baked under nitrogen in a forced draft oven at 190° C. for 30 minutes. he final cured thickness of the encapsulant was approximately 10 microns.

After encapsulation, the average capacitance of the capacitors was 40.4 nF, the average loss factor was 1.5%, the average insulation resistance was 2.4 Gohms. Coupons were then subjected to the brown oxide test described previously. he average capacitance, loss factor, and insulation resistance were 40.1 nf, 1.5%, 2.1 Gohm respectively after the treatment. Unencapsulated coupons did not survive the acid and base exposures.

Example 6

Figure 2A:
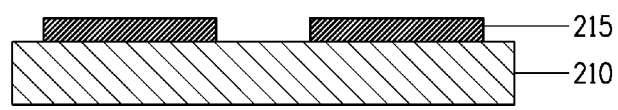
FIG. 2A-2E show the preparation of capacitors on copper foil substrates that were covered by encapsulant.
Figure 2B:
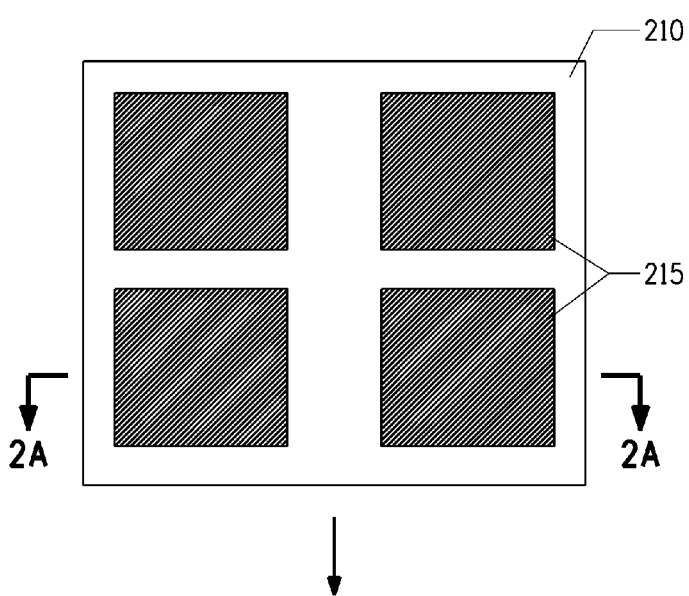

Preparation of Encapsulated Fired-on Foil Capacitors, Lamination with Prepreg and Core to Determine Adhesive Strength and Delamination Tendency Fired-on-foil capacitors were fabricated for use as a test structure using the following process. As shown in FIG. 2A, a 1 ounce copper foil 210 was pretreated by applying copper paste EP 320 (obtainable from E. I. du Pont de Nemours and Company) as a preprint to the foil to form the pattern 215 and fired at 930° C. under copper thick-film firing conditions. Each preprint pattern was approximately 1.67 cm by 1.67 cm. A plan view of the preprint is shown in FIG. 2B.

Figure 2C:
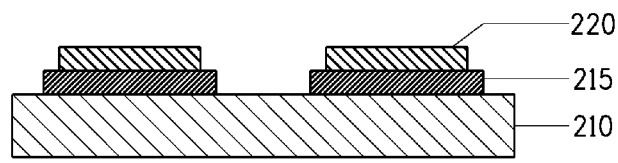

As shown in FIG. 2c, dielectric material (EP 310 obtainable from E.I. du Pont de Nemours and Company) was screen-printed onto the preprint of the pretreated foil to form pattern 220. The area of the dielectric layer was 1.22 cm by 1.22.cm. and within the pattern of the preprint. The first dielectric layer was dried at 120° C. for 10 minutes. A second dielectric layer was then applied, and also dried using the same conditions.

Figure 2D:
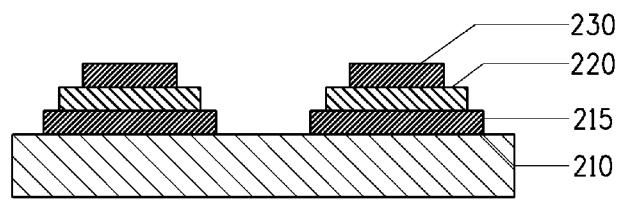

As shown in FIG. 2D, copper paste EP 320 was printed over the second dielectric layer and within the area of the dielectric to form electrode pattern 230 and dried at 120° C. for 10 minutes. The area of the electrode was 0.9 cm by 0.9 cm.

The first dielectric layer, the second dielectric layer, and the copper paste electrode were then co-fired at 930° C. under copper thick-film firing conditions.

Figure 2E:
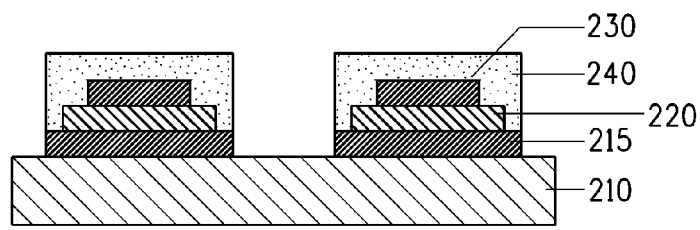
Figure 2F:
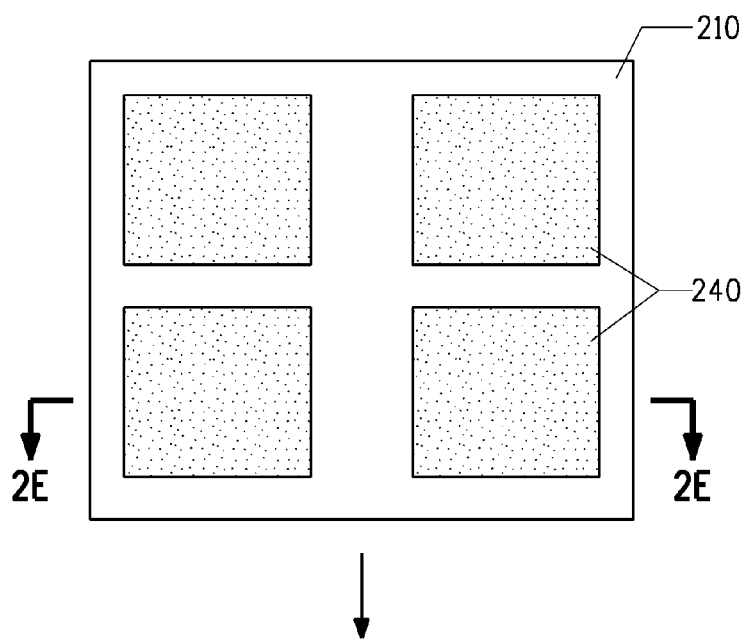
FIG. 2F shows a plan view of the structure.
Figure 2G:
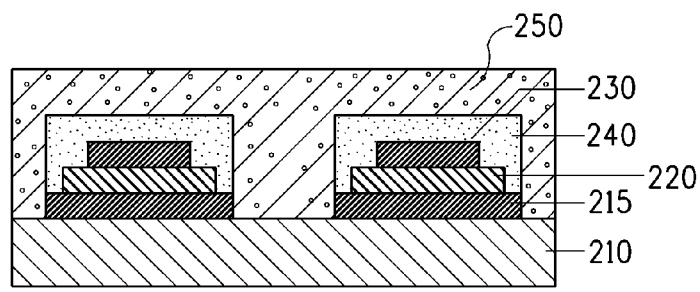
FIG. 2G shows the structure after lamination to resin.

The encapsulant composition as described in Example 3 was printed through a 180 mesh screen over capacitors to form encapsulant layer 240 using the pattern as shown in FIG. 2E. The encapsulant was dried at 120° C. for ten minutes. A second encapsulant layer was then printed directly over the first layer using the paste prepared in Example 4 with a 325 mesh screen. The two-layer structure was then baked for 10 min at 120° C. then cured at 190° C. under nitrogen for 30 minutes to yield a consolidated two-layer composite encapsulant. The final cured encapsulant thickness was approximately 10 microns. A plan view of the structure is shown in FIG. 2F. The component side of the foil was laminated to 1080 BT resin prepreg 250 at 375° F. at 400 psi for 90 minutes to form the structure shown in FIG. 2G. The adhesion of the prepreg to the encapsulant was tested using the IPC-TM-650 adhesion test number 2.4.9. The adhesion results are shown below. Some foils were also laminated with 1080 BT resin prepreg and BT core in place of copper foil. These samples were subjected to 5 successive solder floats at 260° C., each exposure lasting three minutes, to determine the tendency for the structure to delaminate during thermal cycling. Visual inspection was used to determine if delamination occurred. Results are shown below:

| Dry Cycle | Cure Cycle | Encapsulant over Cu (lb force/inch) | Encapsulant over Capacitor (lb force/inch) |
| --- | --- | --- | --- |
| 120° C./10 min | 190° C./30 min | 3.1 | 3.3 |

The failure mode was within the capacitor structure, not the encapsulant interface.

| Dry Cycle | Cure Cycle | Delamination |
| --- | --- | --- |
| 120° C./10 min | 190° C./30 min | no delamination after 5 cycles |

The control (no encapsulant) delaminated 30 seconds into the first solder float

What is claimed is:

1. An organic two-layer encapsulant composition for coating one or more embedded formed-on-foil ceramic capacitors, said two-layer encapsulant comprising a first encapsulant layer and a second encapsulant layer wherein said first encapsulant layer comprises (a) a polyimide and said second encapsulant layer comprises (b) an epoxy-containing cyclic olefin resin, (c) a phenolic resin, (d) an epoxy catalyst; and wherein said embedded formed-on-foil ceramic capacitors comprise a capacitor element and a prepreg wherein said first encapsulant layer is in direct contact with said capacitor element and said second encapsulant layer is in direct contact with said first encapsulant layer.

2. The organic two-layer encapsulant composition of claim 1 wherein the polymide has a water absorption of 2% or less and a glass transition temperature greater than 280° C.

3. The organic two-layer encapsulant composition of claim 1 wherein the epoxy-containing cyclic a olefin resin has a water absorption of 2% or less.

4. The organic two-layer encapsulant composition of claim 1 wherein the phenolic resin has a water absorption of less than 2%; an epoxy catalyst; optionally one or more of an electrically insulated filler, a defoamer and a colorant and one or more organic solvents.

5. The organic two-layer encapsulant composition of claim 1 wherein said first encapsulant layer further comprises one or more components selected from the group comprising an electrically insulated filler, a defoamer, a colorant, an epoxy resin, and mixtures thereof.

6. The encapsulant composition of claim 1 wherein said encapsulant composition is cured to form a two-layer organic encapsulant and wherein said cured two-layer organic encapsulant provides protection to the capacitor when immersed in sulfuric acid or sodium hydroxide having concentrations of up to 30%.

7. The encapsulant composition of claim 1 wherein said encapsulant composition is cured to form a two-layer organic encapsulant and wherein the cured two-layer organic encapsulant provides protection to the capacitor in an accelerated life test of elevated temperatures, humidities and DC bias.

8. The encapsulant composition of claim 1 wherein the encapsulant composition is used to fill an etched trench that isolates the top and bottom electrodes of an embedded capacitor.

9. The encapsulant composition of claim 1 wherein said encapsulant composition is cured to form a cured organic encapsulant and wherein the water absorption is 1% or less.

10. The encapsulant composition of claim 1 wherein the composition can be cured at a temperature of less than or equal to 190° C.

11. The encapsulant composition of claim 1 wherein said encapsulant is cured to form a cured organic encapsulant and wherein the adhesion of said encapsulant to the capacitor and to the prepreg above the capacitor is greater than 2 lb force/inch.

* * * * *

UNITED STATES PATENT AND TRADEMARK OFFICE
CERTIFICATE OF CORRECTION

| | |
|---|---|
| PATENT NO. | : 8,233,261 B2 |
| APPLICATION NO. | : 12/514822 |
| DATED | : July 31, 2012 |
| INVENTOR(S) | : Summers et al. |

It is certified that error appears in the above-identified patent and that said Letters Patent is hereby corrected as shown below:

In Column 3, Line 36, delete "FIG. 2A-2E" and insert -- FIGS. 2A-2E --, therefor.

In Column 5, Line 52, delete "(DOPA)," and insert -- (ODPA), --, therefor.

In Column 8, Line 40, delete "polymide" and insert -- polyimide --, therefor.

In Column 9, Line 36, delete "sec" and insert -- sec. --, therefor.

In Column 11, Line 28, delete "film" and insert -- Film --, therefor.

In Column 12, Line 65, delete "film" and insert -- Film --, therefor.

In Column 12, Line 67, delete "0.17%" and insert -- 0.17%. --, therefor.

In Column 13, Line 48, delete "he" and insert -- The --, therefor.

In Column 13, Line 53, delete "he" and insert -- The --, therefor.

In Column 15, Line 12, in Claim 2, delete "polymide" and insert -- polyimide --, therefor.

Signed and Sealed this
Twenty-second Day of January, 2013

David J. Kappos
*Director of the United States Patent and Trademark Office*